(12) United States Patent
Miura

(10) Patent No.: US 7,405,945 B2
(45) Date of Patent: Jul. 29, 2008

(54) FOUR-WAY LEAD FLAT PACKAGE IC-MOUNT PRINTED CIRCUIT BOARD, METHOD OF SOLDERING FOUR-WAY-LEAD FLAT PACKAGE IC AND AIR CONDITIONER

(75) Inventor: Tsuyoshi Miura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/500,510

(22) Filed: Aug. 8, 2006

(65) Prior Publication Data

US 2007/0034403 A1 Feb. 15, 2007

(30) Foreign Application Priority Data

Aug. 9, 2005 (JP) .............................. 2005-230509

(51) Int. Cl.
*H05K 7/00* (2006.01)
(52) U.S. Cl. ........................ 361/760; 361/736; 361/720
(58) Field of Classification Search ................. 361/760, 361/748, 720, 736, 767, 777; 174/256–257, 174/261–262, 250; 257/778
See application file for complete search history.

(56) References Cited

U.S. PATENT DOCUMENTS 6,998,861 B2 * 2/2006 Nakai et al. .................. 324/755
7,075,016 B2 * 7/2006 Lee et al. .................... 174/250

2007/0006610 A1 * 1/2007 Kawasaki .................... 62/507

FOREIGN PATENT DOCUMENTS

| DE | 38 43 191 C1 | 3/1990 |
| DE | 195 41 340 A1 | 5/1997 |
| DE | 196 09 877 A1 | 9/1997 |
| JP | 05-136551 | 6/1993 |
| JP | 5-315733 A | 11/1993 |
| JP | 8-250844 A | 9/1996 |
| JP | 2635323 | 4/1997 |
| JP | 2001-352159 | 12/2001 |
| JP | 2002-329955 | 11/2002 |
| JP | 2005-175186 | 6/2005 |

\* cited by examiner

*Primary Examiner*—Hung S Bui
(74) *Attorney, Agent, or Firm*—Buchanan Ingersoll & Rooney PC

(57) ABSTRACT

A four-way lead flat package IC-mount printed circuit board, carrying a four-way lead flat package IC and having front soldering land groups placed in front of the four way lead flat package IC and rear soldering land groups placed in the rear of the four-way lead flat package IC, has solder drawing lands, in a neighboring area, between the front soldering land groups and the rear soldering land groups adjacent to the front soldering land groups, and/or a trailing area of the rear soldering land groups. The solder drawing lands are formed with slits substantially parallel to the lines of soldering lands of the front soldering land groups or the rear soldering land groups placed in front of the solder drawing lands. These result in an advantageous effect of enabling the prevention of the occurrence of soldering bridges and soldering residues in the front soldering land groups or the rear soldering land groups.

9 Claims, 6 Drawing Sheets ial FOUR-WAY LEAD FLAT PACKAGE
IC-MOUNT PRINTED CIRCUIT BOARD,
METHOD OF SOLDERING FOUR-WAY-LEAD
FLAT PACKAGE IC AND AIR CONDITIONER

BACKGROUND OF THE INVENTION

1. Field of the Invention

The present invention relates to a printed circuit board on which a four-way lead flat package IC is mounted by soldering using a jet-flow type soldering bath.

2. Description of the Related Arts

In general, due to increasing demands on printed circuit boards for increasing component mounting density, a need has been arising in mounting a four-way lead flat package IC with a narrowed pitch. On the other hand, practical application of lead-free solder, reflecting environmental concerns, has been progressing rapidly. However, lead-free solder has poor soldering reliability than that of lead-containing eutectic solder that has been used in the related art practice. Therefore, short-circuiting has been encountered due to soldering bridges between leads of the four-way lead flat packages IC and the like.

In the related art, in order to prevent the occurrence of the soldering bridges, attempt has heretofore been taken to provide a printed circuit board of this kind prepared with side solder drawing lands, formed in a right-angled isosceles triangle shape, and a rear solder drawing land formed in a quadrate shape (see, for instance, Patent Document 1).

Further, another attempt has been taken to provide first and second soldering lands in separate areas to form side or rear solder drawing lands (see, for instance, Patent Document 2).

Furthermore, another attempt has been taken to provide an eyelet on one side of an area between front soldering land groups and rear soldering land groups while forming a lattice-shaped solder drawing land on the other side of the area between the front soldering land groups and the rear soldering land groups and in a trailing area of the rear soldering land groups (see, for instance, Patent Document 3).

[Patent Document 1] U.S. Pat. No. 2,635,323 (on page 3 and FIG. 1)

[Patent Document 2] Japanese Patent Laid-Open Publication No. 2002-329955 (on pages 4 to 5 and FIGS. 1 to 5)

[Patent Document 3] Japanese Patent Laid-Open Publication No. 2005-175186 (on pages 7 to 8 and FIGS. 8 to 11)

SUMMARY OF THE INVENTION

In the conventional four-way lead flat package IC-mount printed circuit board as set forth above, manufacturing steps need to be carefully managed in order to maintain stable soldering with high quality without occurrence of soldering bridges between the leads of the four-way lead flat package IC. When using lead-free solder with poor soldering ability, issues have arisen such that the narrower the pitch of the leads is, the more difficult it is to maintain further accurate precision.

The present invention has been completed with a view to addressing the above issues and has an object to obtain a four-way lead flat package IC-mount printed circuit board, in which even when attempt is made to solder a four-way lead flat package IC with a narrow pitch, the occurrence of solder-short-circuiting or soldering residues can be surely prevented under easier control, thereby avoiding the occurrence of deficiencies in soldering.

According to the present invention, a four-way lead flat package IC-mount printed circuit board comprises a printed circuit board on which a four-way lead flat package IC is to be mounted and which has front soldering land groups and rear soldering land groups for soldering the four-way lead flat package IC. The printed circuit board includes solder drawing lands formed in a neighboring area between the front soldering land groups and the rear soldering land groups adjacent to the front soldering land groups, and/or a trailing area of the rear soldering land groups, wherein each of the solder drawing lands has a slit formed in substantially parallel to lines of adjacent solder drawing lands of the front soldering land groups or the rear soldering land groups located in front of the solder drawing lands.

Further, an aspect of the present invention provides a method of soldering a four-way lead flat package IC on a printed circuit board on which the four-way lead flat package IC is to be mounted and which has front soldering land groups and rear soldering land groups for soldering the four-way lead flat package IC. The method comprises: a step of mounting the four-way lead flat package IC on the printed circuit board prepared with solder drawing lands formed in a neighboring area between the front soldering land groups and the rear soldering land groups adjacent to the front soldering land groups, and/or a trailing area of the rear soldering land groups, each of the solder drawing lands having a slit formed in substantially parallel to lines of soldering lands of the front soldering land groups or the rear soldering land groups located in front of the solder drawing land; a step of applying flux active agent on the printed circuit board on which the four-way lead flat package IC is mounted; a step of preheating the flux active agent to active temperatures; a step of first solder jet-flowing for soldering lead portions of the four-way lead flat package IC mounted on the printed circuit board using a jet-flow type soldering bath; and a step of second solder jet flowing for removing soldering bridges formed between the lead portions of the four-way lead flat package IC during the first solder jet-flowing step, by the solder drawing lands having the slits.

The four-way lead flat package IC-mount printed circuit board according to the present invention comprises a printed circuit board on which a four-way lead flat package IC is to be mounted and which has front soldering land groups and rear soldering land groups for the four-way lead flat package IC. The printed circuit board includes solder drawing lands formed in a neighboring area, between the front soldering land groups and the rear soldering land groups adjacent to the front soldering land groups, and/or a trailing area of the rear soldering land groups, wherein each of the solder drawing lands has a slit formed in substantially parallel to lines of solder drawing lands of the front soldering land groups located or the rear soldering land groups located in front of the solder drawing lands. Such a structure results in an advantageous effect of enabling the prevention of the occurrence of soldering bridges or soldering residues in the front soldering land groups and the rear soldering land groups.

Furthermore, the method according to the present invention is the method of soldering a four-way lead flat package IC on the printed circuit board on which the four-way lead flat package IC is to be mounted and which has the front soldering land groups and the rear soldering land groups for soldering the four-way lead flat package IC. The method comprises; a step of mounting the four-way lead flat package IC on the printed circuit board prepared with the solder drawing lands formed in the neighboring area, between the front soldering land groups and the rear soldering land groups adjacent to the front soldering land groups, and/or the trailing area of the rear soldering land groups, each of the solder drawing lands having a slit formed in substantially parallel to lines of adjacent soldering lands of the front soldering land groups or the rear soldering land groups located in front of the solder drawing lands; a step of applying the flux active agent on the printed circuit board on which the four-way lead flat package IC is mounted; a step of preheating the flux active agent to active temperatures; a step of first solder jet-flowing-for soldering lead portions of the four-way lead flat package IC mounted on the printed circuit board using the jet-flow type soldering bath; and a step of second solder jet-flowing for removing soldering bridges formed between the lead portions of the four-way lead flat package IC during the first solder jet-flowing step, by the solder drawing lands having the slits. This causes the dissipation of the surface and interfacial tension of solder once drawn to the solder drawing lands, so that a force of solder tending to return to the front and rear soldering land groups is reduced. As a result, an advantageous effect of remarkably decreasing the soldering bridges caused in the front soldering land groups and the rear soldering land groups is obtained with resultant improvement in work efficiency without an increase in manual correction work.

BRIEF DESCRIPTION OF THE DRAWINGS

FIGS. 3A and 3B are enlarged views of chief parts showing a neighboring area between a front soldering land group and a rear soldering land group of the four-way lead flat package IC-mount printed circuit board according to the embodiment 1 of the present invention with FIG. 3A being an enlarged plan view of the chief part while FIG. 3B is an enlarged plan view for illustrating a side solder drawing land section.

FIGS. 4A and 4B are enlarged views of chief parts showing a trailing area of rear soldering land groups of the four-way lead flat package IC-mount printed circuit board according to the embodiment 1 of the present invention with FIG. 4A being an enlarged plan view of the chief part while FIG. 4B is an enlarged plan view for illustrating the rear solder drawing land section.

FIGS. 6A and 6B show an air-conditioner equipped with the four-way lead flat package IC-mount printed circuit board according to the embodiment 1 of the present invention with FIG. 6A being a schematic top view illustrating an outdoor unit while FIG. 6B is a schematic front view illustrating the outdoor unit.

BEST MODE FOR CARRYING OUT THE INVENTION

Embodiment 1

Figure 1:
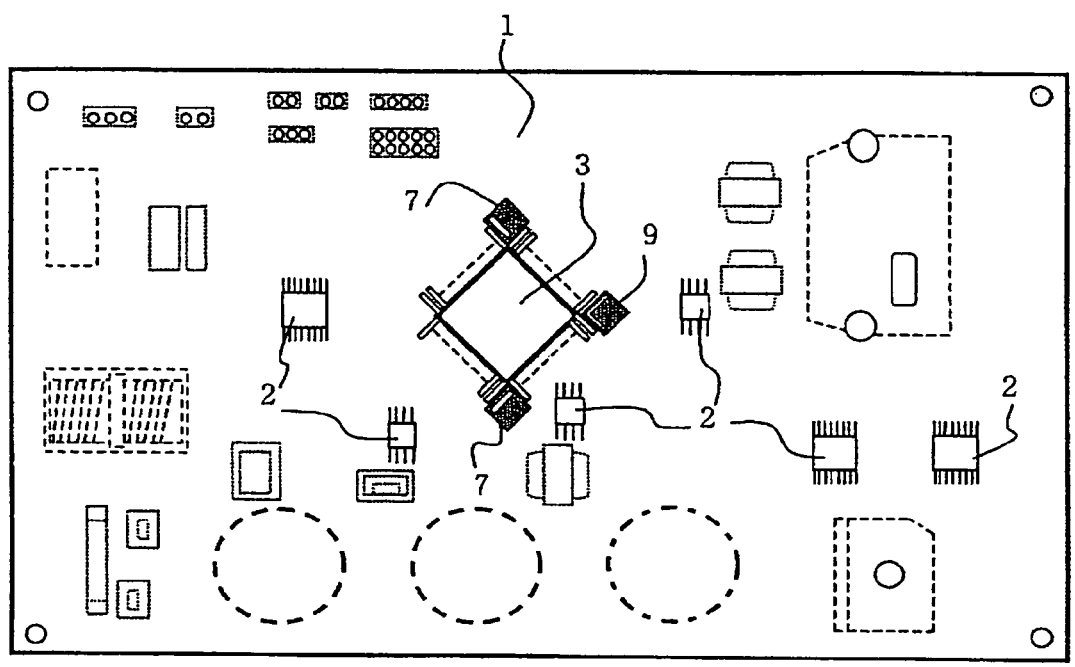
FIG. 1 is a plan view showing a schematic layout structure of a four-way lead flat package IC-mount printed circuit board, as viewed from a rear side thereof, according to an embodiment 1 of the present invention.
Figure 2:
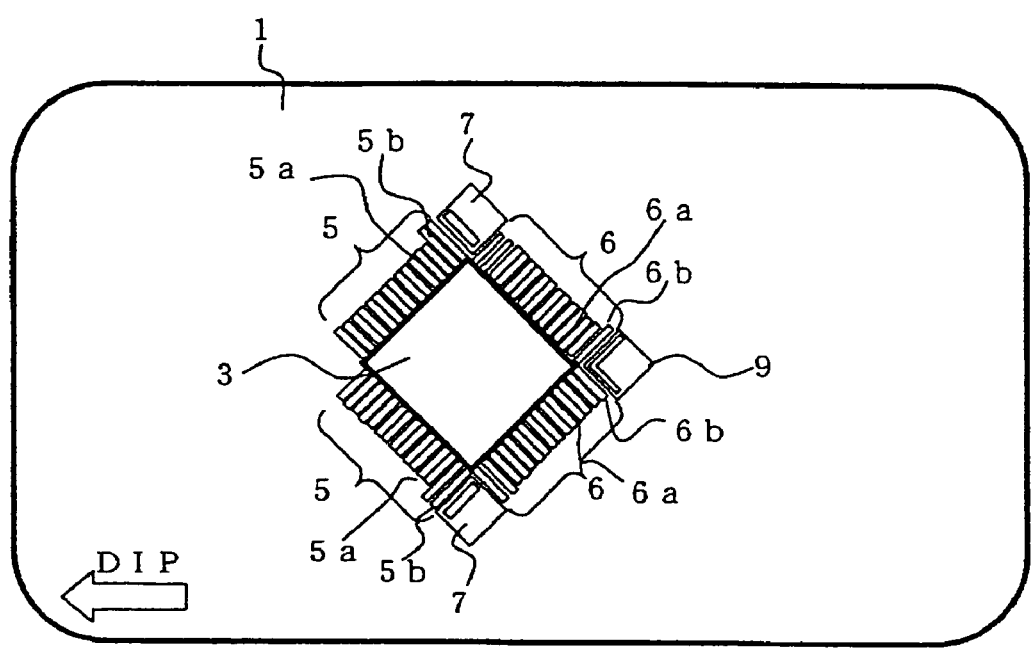
FIG. 2 is a plan view of a chief part illustrating the four-way lead flat package IC according to the embodiment 1 of the present invention.
Figure 3A:
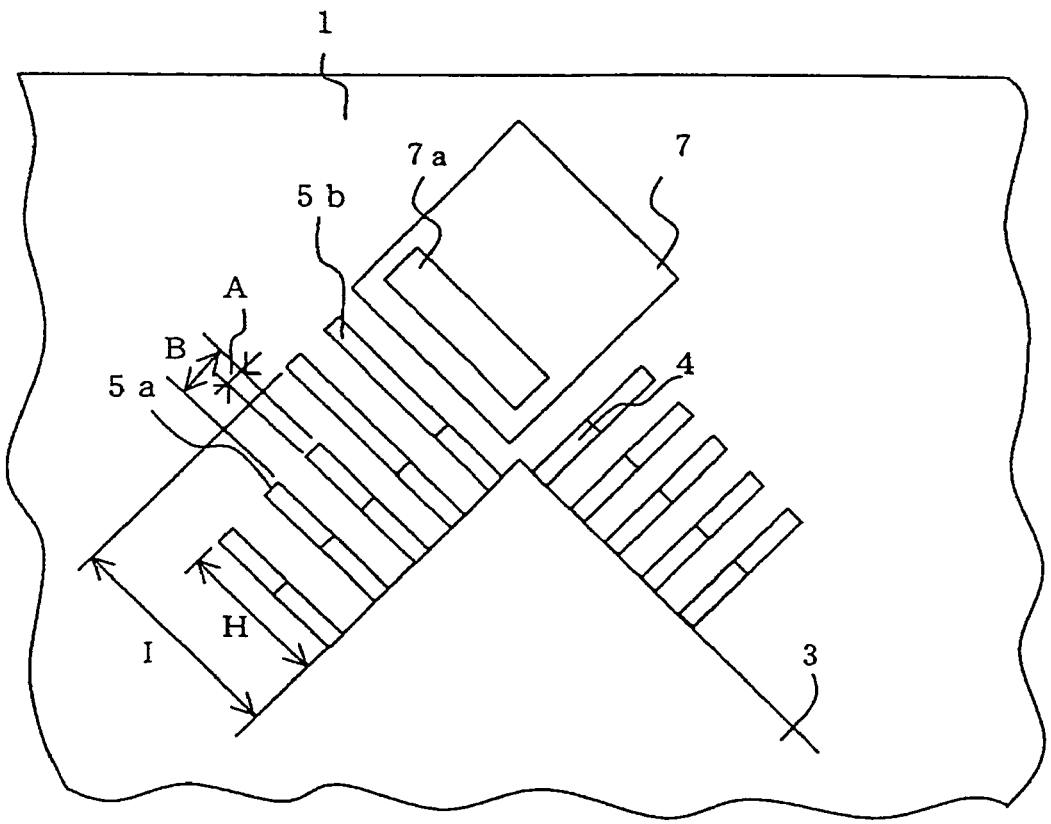
Figure 3B:
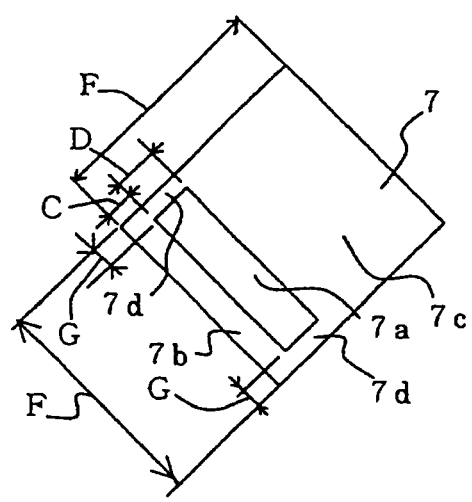
Figure 4A:
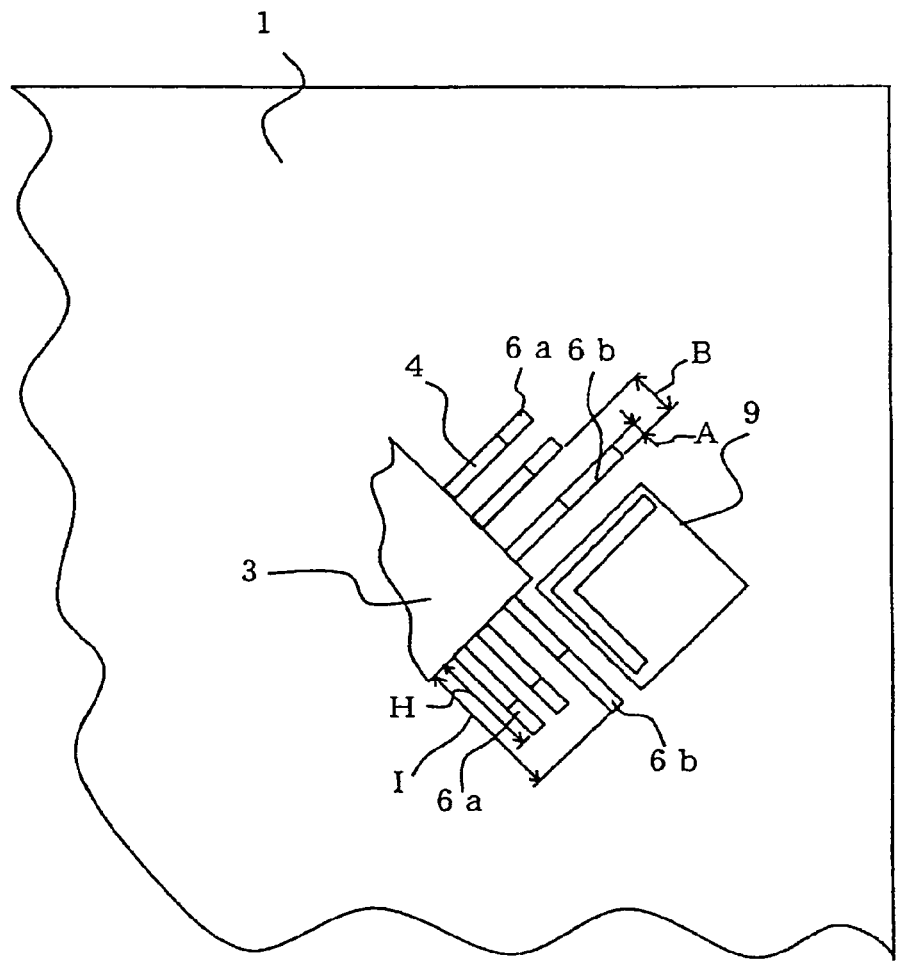
Figure 4B:
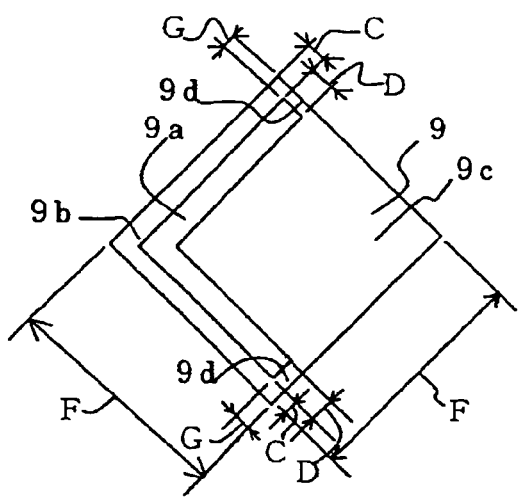

Hereunder, a four-way lead flat package IC-mount printed circuit board according to an embodiment 1 of the present invention is described with reference to FIGS. 1 to 4. Here, FIG. 1 is a plan view showing a schematic layout structure of a four-way lead flat package IC-mount printed circuit board according to the embodiment 1 of the present invention as viewed from a rear side thereof. FIG. 2 is a plan view of a chief part illustrating a portion of the four-way lead flat package IC according to the embodiment 1 of the present invention. FIGS. 3A and 3B are enlarged plan views of the chief parts showing a neighboring section between a front soldered land group and a rearward soldered land group of the four-way lead flat package IC-mount printed circuit board according to the embodiment 1 of the present invention, with FIG. 3A showing an enlarged plan view of the chief part and FIG. 3B showing an enlarged plan view for illustrating a side solder drawing land. FIGS. 4A and 4B are enlarged plan views of the chief parts showing a trailing area of the rear soldering land groups of the four-way lead flat package IC-mount printed circuit board according to the embodiment 1 of the present invention, with FIG. 4A showing an enlarged plan view of the chief part and FIG. 4B showing an enlarged plan view for illustrating a rear solder drawing land.

In the drawing figures, the printed circuit board 1 has a front surface carrying thereon automatically mounted component parts (such as, chip component resistors, chip component capacitors, chip component diodes, discrete resistors, discrete capacitors, discrete diodes, etc) (none of these components being shown), and manually inserted components (such as, large capacity resistors, hybrid ICs, transformers, coils, large capacity semiconductors, large capacity capacitors, etc) (none of these components being shown).

Further, the printed circuit board 1 has a rear surface equipped with a copper foil (not shown). Moreover, automatically mounted SOP packages IC2 (Small Outline Package IC) are provided in order to keep this rear surface under a status as plane as possible, and a four-way lead flat package IC3 is mounted and placed by an automatic mounting machine (not shown) with inclination at an angle of 45° to a direction as shown by an arrow in FIG. 2 which is the direction of a jet-flow type soldering travel, such that one corner is placed at a leading portion and a diagonal corner is placed at a trailing portion with respect to the jet-flow type soldering travel direction.

The printed circuit board 1 has front soldering land groups 5, forming the above-described leading corner section, and rear soldering land groups 6, forming the above-described trailing corner portion, which are formed in compliance with leads 4 of the four-way lead flat package IC3. The front soldering land groups 5 comprises front soldering land 5*a* situated on the front side in the soldering travel and front trailing soldering lands 5*b*, which are situated on the rear side and formed to be longer in length than front soldering lands 5*a*. Likewise, the rear soldering land groups 6 comprises rear soldering lands 6*a* situated on front side and rear trailing soldering lands 6*b*, which are situated on the rear side and formed to be longer in length than front soldering lands 6*a*.

Further, side solder drawing lands 7 are formed on both sides, respectively, in neighboring areas between the front soldering land groups 5 and the rear soldering land groups 6. Each of the side solder drawing lands 7 has a slit 7*a* formed in parallel to lines of a neighboring soldering lands 5*b*. Furthermore, a rear solder drawing land 9 is formed in the rear of the rear soldering land groups forming the trailing corner portion. The rear solder drawing land 9 has a slit 9*a* formed in parallel to the lines of neighboring soldering lands 6*b*.

With the printed circuit board 1 according to the present embodiment 1 of the present invention, a principal feature resides in the fact that a difference exists in shape of the side solder drawing lands 7 and the rear solder drawing land 9 in contrast to those of the printed circuit board of the related art technology.

That is the side solder drawing lands 7 and the rear solder drawing land 9 of the printed circuit board 1 according to the present embodiment 1 of the present invention are shown in FIGS. 2 to 4. Among the solder drawing lands, the sided solder drawing lands 7 have slits 7a, respectively, each of which is elongated in the same direction as that of the longitudinal direction of the neighboring front trailing soldering land 5b of the front soldering land groups 5, so as to be substantially in parallel to the front trailing soldering land 5b. Also, among the solder drawing lands, the rear solder drawing land 9 has a slit 9a each of which is respectively elongated in the same direction as the longitudinal direction of the neighboring rear trailing soldering land 6b of the rear solder drawing land groups 6, so as to be substantially in parallel to the respective rear trailing soldering lands 6b.

Now, description is made of one example of dimensions and the like of the side solder drawing lands 7 and the rearward solder drawing land 9 or the like. For example, as shown in FIGS. 3A and 3B and FIGS. 4A and 4B, the four-way lead flat package IC 3 has leads 4 each with a width A in dimension of 0.35 mm and a pitch B in dimension of 0.65 mm. Also, the soldering lands 5a, 6a are determined to have the substantially same width and pitch as the width A and the pitch B in dimension of the leads 4 per se so as to provide an ease of performing the soldering.

Further, a side solder drawing land 7, made of a copper foil as shown in FIGS. 3A and 3B, is formed in a square solder drawing land with an external dimension F of 6.8 mm×6.8 mm. The slit 7a with no existence of the copper foil is formed in a position defined as follows. A dimension C from a side of the side solder drawing land 7, which is opposed to the adjacent front soldering land group 5, to the slit 7a is set 0.9 mm, and the slit 7a has a width D of 1.0 mm. Moreover, the side solder drawing land 7 has copper foil rest portions (each in dimension G), formed on both ends of the slit 7a in a longitudinal direction thereof, which play a role as copper foil joint portions 7d which interconnects a forward portion 7b between the opposed side and the slit 7a and a backward portion 7c formed on the backward side of the slit 7a. The joint portions 7d are formed in a direction perpendicular to the lines of the neighboring soldering lands 5b, that is, on both sides of the side solder drawing land 7 in a form of narrow copper foil rests each with a width of 0.65 mm. The above described dimensions of the side solder drawing land 7 with the slit 7a are shown in an exemplary structure.

Thus, by the slit 7a, the forward portion 7b of the sided solder drawing land 7 has a small surface area and the backward portion 7c has a large surface area. These cause solder to be easily drawn to the backward portion 7c from the forward portion 7b. Also, these suppress solder from returning from the backward portion 7c to the forward portion 7b and prevent the occurrence of solder residues with the resultant capability of preventing solder from returning from the side solder drawing land 7 to the front soldering land group 5. Also, if a clearance between the side solder drawing land 7 and the adjacent front trailing soldering land 5b is set to have a value substantially equal to a distance between the adjacent soldering lands 5a, solder can be easily drawn to the side solder drawing land 7.

Next, the rear solder drawing land 9 is described below. With this example, the rear solder drawing land 9 and the slits 9a are formed in the substantially same positional relationship and dimension as those of the side solder drawing land 7 and the slit 7a. As shown in FIGS. 4A and 4B, the rear solder drawing land 9 is made of a copper foil or the like in a square solder drawing land with an external dimension F of 6.8 mm×6.8 mm. A slit 9a with no existence of the copper foil is formed in a L shape and in a position defined as follows. A dimension C from sides of the rear solder drawing land 9, which are opposed to the adjacent rear soldering land groups 6, to the slit 9a is set 0.9 mm, and the slit 9a has a width D of 1.0 mm. Moreover, the rear solder drawing land 9 has copper foil rest portions (each in dimension G), formed on both ends of the slit 9a in longitudinal directions thereof, which play a role as copper foil joint portions 9d which interconnects a forward portion 9b between the opposed sides and the slit 9a to a backward portion 9c formed on the backward side of the slit 9a. The joint portions 9d are formed in a direction perpendicular to the lines of the neighboring soldering lands 6b, that is, on both sides of the rear solder drawing land 9 in narrow copper foil rests each with a width of 0.65 mm. The above described dimensions of the solder drawing land 9 with the slit 9a are shown in an exemplary structure.

Also, with this example, the slit 9a is formed in the solder drawing land 9 such that the slit 9a is spaced from the forward sides of the solder drawing land 9, which are opposed to the adjacent soldering land groups 6, with the distance (in dimension C) of 0.9 mm so as to make the slits 9a to be contiguous in shape to form an L-shaped configuration. By the slit 9a, the forward portion 9b has a small surface area and the backward portion 9c has a larger surface area than that of the forward portion 9b. These cause solder to be easily drawn to the backward portion 9c while enabling the suppression of solder from returning from the backward portion 9c to the forward portion 9b. Thus, solder can be easily drawn from the rear soldering land groups 6 to the rear solder drawing land 9 while preventing solder from returning from the rear solder drawing land 9 to the adjacent rear soldering land groups 6 for thereby precluding the occurrence of solder residues. Also, if a clearance between the rear solder drawing land 9 and the rear soldering land groups 6 is set to have a value substantially equal to a distance between the adjacent soldering lands 6a, solder can be easily drawn to the rear solder drawing land 9.

Further, the front trailing soldering rear lands 5b and the rear trailing soldering lands 6b are formed in lengthwise dimension I longer than lengthwise dimension H of the other soldering lands 5a, 6a as shown in FIGS. 3A and 3B and FIGS. 4A and 4B. That is, the dimension I of the trailing lands 5b, 6b is made longer than the dimension H of the soldering lands 5a, 6a arranged on the front side. For example, such a dimension can be expressed as $5.3 \text{ mm} \leq H \leq I \leq 6.8 \text{ mm}$. With this example, the dimension I of the trailing lands 5b, 6b is made less than the external dimension F, representing the lengthwise dimension of the forward portions 7b or 9b of the adjacent side solder drawing lands 7 or the rear solder drawing land 9, so as to allow neighboring portions of the side solder drawing lands 7 for drawing solder from the front soldering land groups 5 to have the same or increased lengths. Moreover, neighboring portions of the rear solder drawing land 9 for drawing solder from the rear soldering land groups 6 are determined to have the same or increased lengths. Accordingly, solder can be easily drawn to the side solder drawing lands 7 or the rearward solder drawing land 9. Also, with this example, the dimension H of the soldering lands 5a, 6a is set to be greater than a soldering portion of the lead with a length of 5.3 mm.

Figure 5:
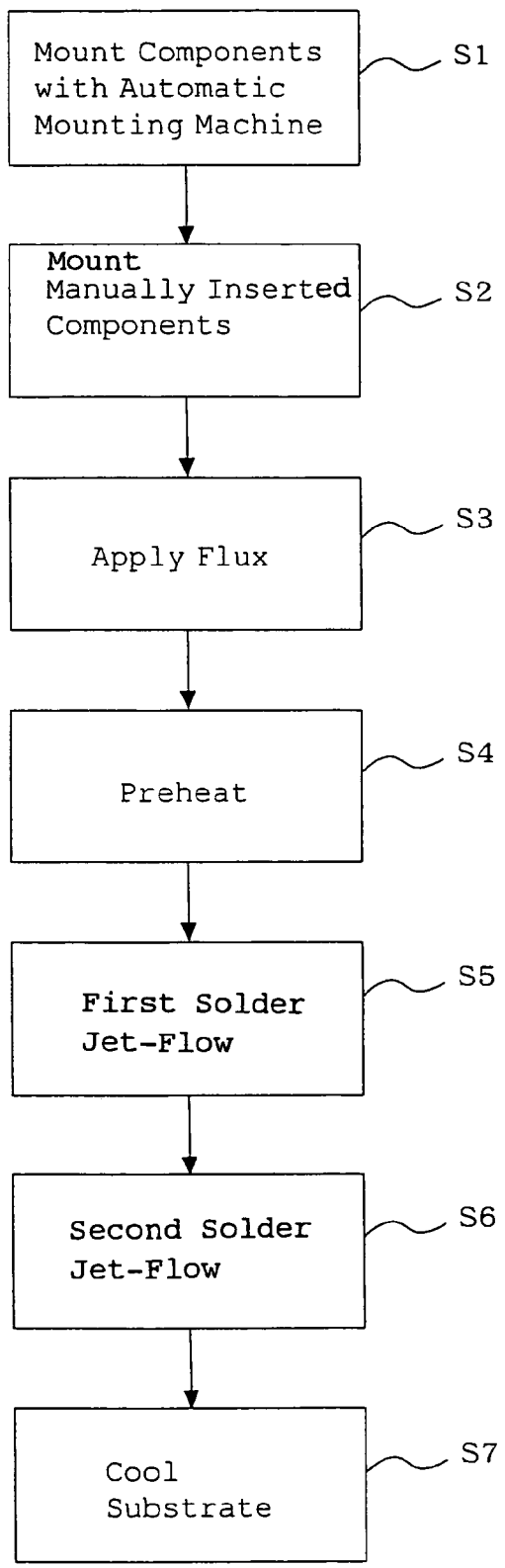
FIG. 5 is a flowchart showing a sequence of performing jet-flow type soldering work steps for the four-way lead flat package IC according to the embodiment 1.

Next, sequence of soldering the four-way lead flat package IC3 is described. FIG. 5 is a flowchart showing jet-flow type soldering work steps for the four-way lead flat package IC of the embodiment 1. Referring to FIG. 5, description is made of sequence of soldering the four-way lead flat package IC on the printed circuit board 1 with such a structure mentioned above using a jet-flow type soldering bath (not shown). In the embodiment 1 according to the present invention, first, component parts (such as, chip-part resisters, chip-part capacitors, chip-part diodes, discrete resistors, discrete capacitors, discrete diodes, etc.) (not shown) and the four-way lead package IC3 are automatically mounted on front and rear surfaces of the printed circuit board 1, by an automatic mounting machine in step S1 for automatically mounting parts. Next, in step S2 for manually mounting parts, manually-inserted parts (such as, for instance, large-capacity resistors, hybrid ICs, transformers, coils, large-capacity semiconductors, large-scaled capacitors, etc.) are manually inserted and mounted. Subsequently, in step S3 for flux applying, flux active agent is applied onto the rear surface of the four-way lead flat package IC-mount printed circuit board 1 so as to allow solder to be fitted to a copper foil. Then, in step S4 for preheating, the heating is carried out to allow flux applied in step S3 to be raised to an optimal active temperature.

Thereafter, in step S5 for first solder jet-flowing, the lead portions of the component parts are evenly soldered to the rear surface of the printed circuit board 1 by means of a solder jet-flow means (not shown) having a nozzle formed with multiple apertures for injecting solder like water of a fountain. Upon completion of the step 5 for first solder jet-flowing, then, the operation is executed in second soldering jet-flowing step in S6, the printed circuit board 1 is moved on a flat solder level in a soldering bath along a direction as shown by an arrow in FIG. 2, so as to remove bridged solder remaining between the leads of the component parts such as the leads 4 of the four-way lead flat package IC 3, caused in the first solder jet-flowing step. Lastly, in step S7 for substrate cooling, the printed circuit board 1 is cooled and this work is completed.

Next, the soldering of the four-way lead flat package IC3 is described further in detail. When the mounted four-way lead flat package IC3 is caused to move into a solder jet-flow area of the jet-flow soldering bath, solder flows to the front soldering land groups 5 on both sides corresponding to the front soldering leads 4 of the four-way lead flat package IC3, that is, travels rearward via the front soldering lands 5a. When this takes place, solder moves rearward sequentially forming bridges caused by action of surface and interfacial tension of the front soldering land 5a of the front soldering land groups 5 and the individual leads 4 of the four-way lead flat package IC3. Then, solder reaching to the rear areas of the front soldering land groups 5, is drawn to the adjacent side solder drawing lands 7.

Further, even in the rear soldering land groups 6, similarly, solder flows to the rear soldering land groups 6 on both sides corresponding to the rear soldering leads 4 of the four-way lead flat package IC3, that is, to portions of the rear soldering lands 6a and travels rearward. When this takes place, solder moves rearward sequentially forming bridges caused by action of surface and interfacial tension of the soldering lands 6a of the rear soldering land groups 6 and the individual leads 4 of the four-way lead flat package IC3. Then, solder reaching to the rear areas of the rear soldering land groups 6, is drawn to the adjacent rear solder drawing land 9.

In such a way, the side solder drawing lands 7 allow solder to be drawn from the rear areas of the front soldering land groups 5 to the side solder drawing lands 7. Also, the rear solder drawing land 9 allows solder to be drawn from the rearward areas of the rear soldering land groups 6. In this case, however, solder drawn to the side solder drawing lands 7 once and solder drawn onto the rear solder drawing land 9 resulting from the action of surface and interfacial tension of solder suffer from a force to return from the side solder drawing lands 7 to the adjacent front soldering land groups 5, and to return from the rear solder drawing land 9 to the adjacent soldering land groups 6.

Here, by forming the slits 7a, 9a in the side solder drawing lands 7 and the rear solder drawing land 9 in substantially parallel with the lines of the front soldering lands 5a of the front soldering land groups 5 or the rear soldering lands 6a of the rear soldering land groups 6 as proposed by the embodiment 1, solder is easily drawn to the side solder drawing lands 7 and the rear solder drawing land 9. Also, surface and interfacial tension of solder on the side solder drawing lands 7 and the rear solder drawing land 9, which has been drawn once, is dissipated, so that a force to return to the adjacent front and rear soldering land groups 5 and 6 is reduced. This results in remarkable reduction in the occurrence of soldering bridges in the front soldering land groups 5 and the rear soldering land groups 6. Verifications have turned out that if the side solder drawing lands 7 and the rear solder drawing land 9 are merely formed in flat shapes or reticular patterns with no formation of the slits 7a, 9a as in the related art, the use of the four-way lead flat package IC with a narrow distance between the leads 4 and lead-free solder with large surface and interfacial tension remarkably increases occurrence of soldering short circuits (bridges) and solder residues due to bubbles generated during soldering in front soldering land groups 5 and the rear soldering land groups 6, in comparison with the present embodiment according to the present invention.

In addition, the slit 7a is formed in the side solder drawing land 7 so that the forward portion 7b is made small, the backward portion 7c is made larger than the forward portion 7b, and further narrow copper foils are left on both end sides of the slit 7a to form the joint portions 7d which connect the forward portion 7b to the backward portion 7c. Further, the slit 9a is formed in the rear solder drawing land 9 so that the forward portion 9b is made small, the backward portion 9c is made larger than the forward portion 9b, and further, narrow copper foils are left on both end sides of the slit 9a to form the joint portions 9d which connect the forward portion 9b to the backward portion 9c. It has been confirmed that by these configurations, the joint portions 7d, 9d made of the narrow copper foils left on the both sides of the slits 7a, 9a can regulate and suppress a force to return to the neighboring front and rear soldering land groups 5,6, due to surface and interfacial tension, which acts on solder once drawn onto the side solder drawing lands 7 and the rearward solder drawing land 9. Such configurations make it possible for the slits 7a, 9a to dissipate solder to avoid the occurrence of bubbles, so that the occurrence of solder residues after a soldering step resulting from the bubbles is eliminated. Thereby, a manual-correction working process for the purpose of removing the solder residues can be eliminated in a subsequent stage with the resultant realization of the saving of a step.

Moreover, by forming the front trailing soldering lands 5b of the front soldering land groups 5 and the rear trailing soldering lands 6b of the rear soldering land groups 6 to be longer in shape than the other soldering lands 5a, 6a, a force of drawing solder is increased and an advantageous effect of reducing short-circuiting of solder can be demonstrated.

Further, solder-drawing actions of the solder drawing lands 7, 9 of the present embodiment stated above is explained below. As to each of the side solder drawing lands 7, a slit 7a is formed in substantially parallel to the lines of the soldering lands 5a so that a forward portion 7b on the forward side of the slit 7a is made smaller than a backward portion 7c on the backward side of the slit 7a. Further, joint portions 7d are formed in the form of the narrow copper foils on both end sides of the slit 7a in longitudinal direction thereof. With such structure, the slit 7a juxtaposed in substantially parallel to the lines of the soldering lands 5a in face-to-face relationship in a flowing direction of solder allows solder coming from the adjacent front soldering land groups 5 to be easily drawn from the forward portion 7b, to the backward portion 7c in a smooth fashion. Moreover, the presence of a difference in surface area between the forward portion 7b with a small surface area and the backward portion 7c with a large surface area causes solder to be easily drawn from the forward portion 7b to the backward portion 7c with the large surface area. And, solder is easily and smoothly drawn from the forward portion 7b to the backward portion 7c through the joint portions 7d contiguous with these portions. Therefore, by these actions, solder is smoothly drawn from the front soldering land groups 5 to the solder drawing lands 7.

Then, solder drawn to the backward portion 7c once tends to return to the forward portion 7b due to a returning force. In this moment, solder smoothly passes across the joint portions 7d on both sides of the slit 7a to return from the backward portion 7c to the forward portion 7b little by little. This prevents a large amount of solder from rapidly returning from the backward portion 7c to the forward portion 7b and the front soldering land group 5 to avoid deficiencies such as the occurrence of soldering short circuit and the occurrence of large number of solder residues. Incidentally, while the joint portions 7d may have widths different from each other on both sides, the joint portions 7d are formed in the same width on both sides in the present embodiment to enable the joint portions 7d to draw solder in a favorable balance while suppressing solder from returning in a balanced state.

Furthermore, the rear solder drawing land 9 has a slit 9a, formed in substantially paralleled to the lines of the soldering lands 6a, the forward portion 9b with a small surface area, the backward portion 9c with the large surface area and the joint portions 9d in the form of the narrow copper soils left on both end sides of the slit 9a to have the substantially same functions as those of the slit 7a, the forward portion 7b, the backward portion 7c and the joint portions 7d of the side solder drawing land 7. With such structure, solder is smoothly drawn from the forward portion 9b to the backward portion 9c with the resultant consequence of solder being smoothly drawn from the rear soldering land groups 6 to the rear solder drawing land 9. Also, solder is caused to smoothly return from the backward portion 9c to the forward portion 9b via the joint portions 9d on both end sides of the slit 9a. This avoids the occurrence of deficiencies such as soldering circuit and the occurrence of a large number of solder residues in the rear soldering land groups 6. Incidentally, similar to the joint portions 7d, the joint portions 9d have the same width on the both end sides in the present embodiment, to enable the joint portions 9d to draw solder in a favorable balance while suppressing solder from the returning in a balanced state.

Moreover, in the embodiment set forth above, when the slit 7a is formed in the side solder drawing land 7 in substantially parallel to the lines of the adjacent soldering lands 5b of the front soldering land groups 5 with the better degree of parallelization, the greater advantageous effect will be obtained. However, the presence of the substantially parallel relationship results in the advantageous effect. For example, if the substantially parallel relationship falls in a range of a difference belonging to an extent of an angle of 10 degrees, an adequate advantageous effect can be obtained. Additionally, in the embodiment set forth above, when the slit 9a of the rear solder drawing land 9 is formed in substantially parallel to the adjacent soldering lands 6b with the better parallelization degree, the greater advantageous effect will be similarly obtained. However, the presence of the substantially parallel relationship results in an adequate advantageous effect. For example, if the substantially parallel relationship falls in a range of a difference belonging to an extent of an angle of 10 degrees, an adequate advantageous effect can be obtained.

As mentioned above, the four-way lead flat package IC-mount printed circuit board 1 according to the present embodiment of the present invention enables the suppression of the occurrence of soldering short circuit generated at the time when solder moves rearward while forming bridges due to surface and interfacial tension, during a step of soldering the four-way lead flat package IC3 using the jet-flow soldering bath, and the occurrence of solder residues resulting from bubbles occurring during the soldering step in further reliable fashions with the resultant effect of reduction of portions where the soldering short circuit may take place. Also, the solder drawing lands 7, 9 with small surface area can be realized, making it possible to make efficient pattern design. Besides, lead-free solder which is environmentally preferable can be employed, so that an environmentally preferable printed circuit can be provided.

Further, while the solder drawing lands 7, 9 and associated slits 7a, 9a, the forward portions 7b, 9b, the backward portions 7c, 9c and the joint portions 7d, 9d have been indicated in the present embodiment described above with reference to exemplary dimensions and shapes or the like, the present invention is not limited to these factors and these factors may be suitably altered depending on conditions of a size of the four-way lead flat package IC3 or the other related component parts or the like within a range to have advantageous effects. In addition, while the embodiment has been described above with reference to a structure including both of the side solder drawing lands 7 formed with the individual slit 7a and the rear solder drawing land 9 formed with the slit 9a, even a structure incorporating only the side solder drawing lands 7 formed with the individual slit 7a or the rear solder drawing land 9 formed with the slit 9a results in consequences of obtaining the above-described advantageous effects, respectively. Also, while the embodiment has been described above with reference to a structure wherein the side solder drawing lands 7, formed with the slit 7a, respectively, are formed on both sides, a side solder drawing land 7 with a slit 7a may be formed on one side. Even with such a structure, a section of the side solder drawing land 7 with the slit 7a has the same advantageous effects as those discussed above.

Figure 6A:
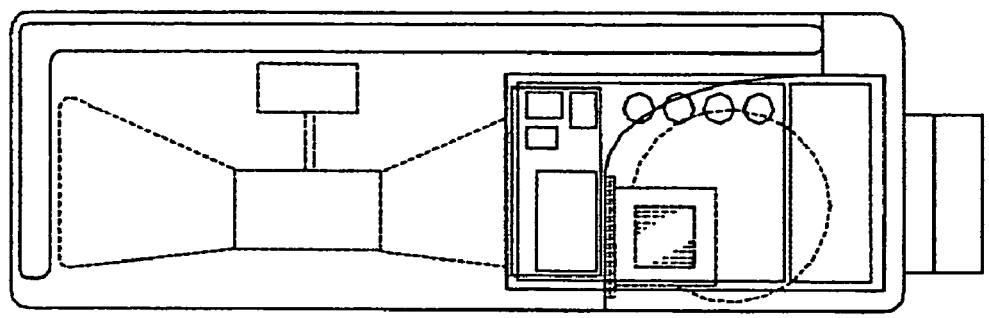
Figure 6B:
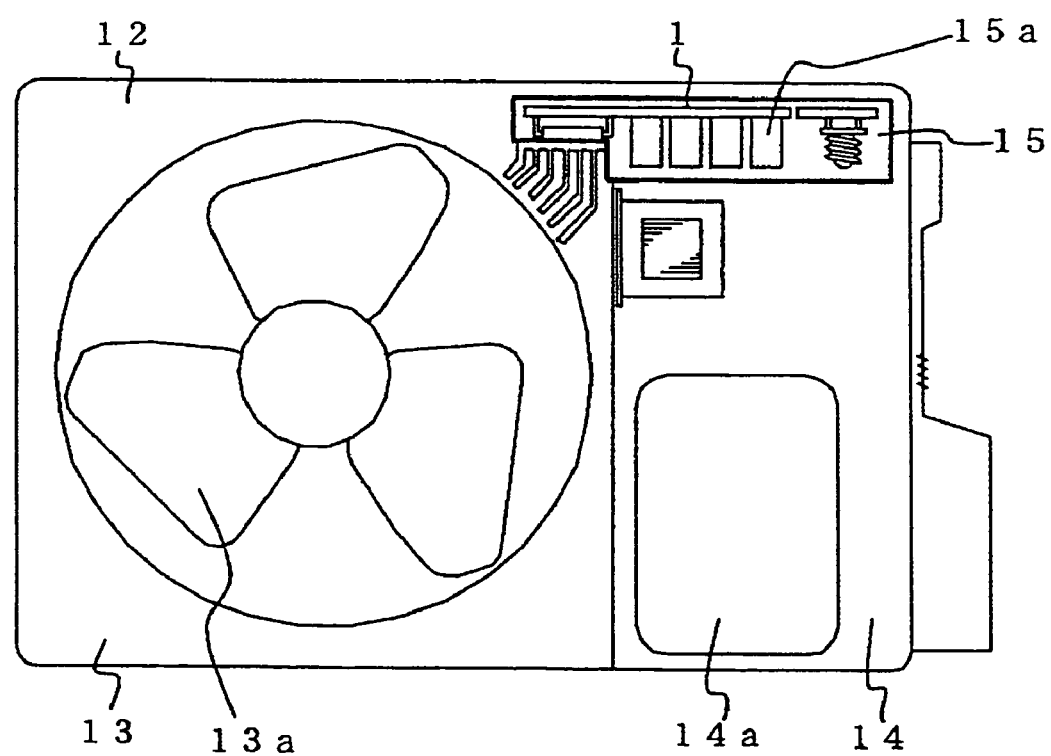

Next, an example of using the printed circuit board 1 set forth above is described. FIGS. 6A and 6B, show an air-conditioner having the four-way lead flat package IC-mount printed circuit board according to the embodiment 1 of the present invention and FIG. 6A is a schematic top view for illustrating an outdoor unit while FIG. 6B is a schematic front view for illustrating the outdoor unit. In the drawing figures, the outdoor unit 12 of the air conditioner is comprised of a fan room 13 having an air blower 13a, and a compressor chamber 14 including a compressor 14a and an electric parts box 15 in a flat shape. The electric parts box 15 is equipped with the printed circuit board 1 having the four-way lead flat package IC3. The printed circuit board 1 is fitted so that its front surface carrying electrical component parts 51a faces downward and its reverse surface formed in a planar state with the copper foil and faces upward.

Accordingly, the electric parts box 15, equipped with the printed circuit board 1 according to the embodiment of the present invention, can be made horizontally flat. This has an advantageous effect that an accommodation space of the electric parts box 15 can be made compact, so that flexibility for another part space is increased to enable assembly work to be done easily. Also, this results in another advantageous effect of improving a quality of an air-conditioner upon incorporating the four-way lead flat package IC-mount printed circuit board with a measure taken to prevent the occurrence of soldering bridges and soldering residues.

In such a way, the four-way lead flat package IC-mount printed circuit board of the embodiment set forth above is comprised of the printed circuit board 1 carrying thereon the four-way lead flat package IC3 and having the front soldering land groups 5 and the rear soldering land groups 6, for the four-way lead flat package IC3, the solder drawing lands 7, 9 located in neighboring areas between the front soldering land groups 5 and the rear soldering land groups 6 adjacent to the front soldering land groups 5, and/or in a trailing area of the rear soldering land groups 6. The solder drawing lands 7, 9 are formed with the slits 7*a*, 9*a* in substantially parallel to the lines of the trailing soldering lands 5*b*, 6*b* located in front of the solder drawing lands 7, 9. These result in an advantageous effect of enabling the prevention of the occurrence of soldering bridges and soldering residues in the front soldering land groups or the rear soldering land groups.

Further, the trailing soldering lands 5*b*, 6*b* of the front soldering land groups 5 or the rear soldering land groups 6 are formed to be longer than the soldering lands 5*a*, 6*a* located in front of the trailing soldering lands with the resultant advantageous effect of drawing solder rearward easily.

Furthermore, in the solder drawing lands 7, 9, each solder drawing land has a slit 7*a*, 9*a* so that the surface area of the forward portion is made smaller than that of the backward portion. This provides an advantageous effect of drawing solder from the forward portions to the backward portions while suppressing a return of solder.

Moreover, the solder drawing lands 7, 9 have the joint portions 7*d*, 9*d* in the form of the copper foils formed on both sides of the slits 7*a*, 9*a* for connecting the forward portions and the backward portions, respectively. This provides an advantageous effect of drawing solder from the forward portions to the backward portions easily while suppressing a return of solder.

In addition, the four-way lead flat package IC3 is placed obliquely with respect a solder flow traveling direction over the jet-flow type soldering bath during a soldering process. This provides an another advantageous effect of easy soldering.

Besides, the four-way lead flat package IC3 is soldered using lead-free solder with the resultant advantageous effect of obtaining a printed circuit board which is environmentally preferable.

Further, the method of soldering the four-way lead flat package IC in the embodiment set forth above comprises the method of soldering the four-way lead flat package IC3 to be mounted on the printed circuit board 1 that has the front soldering land groups 5 and the rear soldering land groups 6. This method comprises a mounting step for mounting the four-way lead flat package IC3 on the printed circuit board 1 prepared with the solder drawing lands 7, 9, formed in the neighboring areas between the front soldering land groups 5 and the rear soldering land groups 6, and/or the trailing area of the rear soldering land groups 6, which have the slits 7*a*, 9*a* formed in substantially parallel to the lines of the adjacent solder drawing lands of the front soldering land groups 5 or the rear soldering land groups 6 located in front of the solder drawing lands 7, 9. The method further comprises a flux applying step for applying flux active agent on the printed circuit board 1 on which the four-way lead flat package IC3 is mounted, a preheating step for preheating flux active agent to the active temperatures, a first solder jet-flowing step for soldering the portions of the leads 4 of the four-way lead flat package IC3 mounted on the printed circuit board 1, using the jet-flow type soldering bath, and a second solder jet-flowing step for removing solder bridges formed between the leads 4 of four-way lead flat package IC3 during the first solder jet-flowing step, by the solder drawing lands 7, 9 having the slits 7*a*, 9*a*. This causes the dissipation of the surface and interfacial tension of solder once drawn to the solder drawing lands 7, 9 so that a force of solder tending to return to the front soldering land groups 5 and the rear soldering land groups 6 is reduced. As a result, an advantageous effect of remarkably decreasing the soldering bridges caused in the front soldering land groups 5 and the rear soldering land groups 6 is obtained with the resultant improvement in work efficiency without an increase in refinement work in a subsequent step.

Furthermore, the method of soldering the four-way lead flat package IC3 provides an advantageous effect wherein the four-way lead flat package IC3 is transferred in the solder flow traveling direction over the jet-flow type soldering bath and the front soldering land groups 5 and the rear soldering land groups 6 are inclined with respect to the solder flow traveling direction to provide easy soldering.

Moreover, in the air conditioner of the embodiment set forth above, the electric parts box 15, accommodating therein the printed circuit board 1 having the solder drawing lands 7, 9 is disposed in an area above the compressor 14*a* in the compressor chamber 14. The printed circuit board 1 is equipped with the four-way lead flat package IC3, and is prepared with the front and rear soldering land groups 5, 6, and the solder drawing lands 7, 9 formed in the neighboring areas between the front soldering land groups 5 and the rear soldering land groups 6, and/or the trailing area of the rear soldering land groups 6, which have the slits 7*a*, 9*a* formed in substantially parallel to the lines of the solder drawing lands of the front soldering land groups 5 or the rear soldering land groups 6 located in front of the solder drawing lands 7, 9. This allows the air conditioner to be equipped with the four-way lead flat package IC-mount printed circuit board that can prevent the occurrence of the soldering bridges caused in the front soldering land groups 5 and the rear soldering land groups 6 with the resultant improvement in quality of the air conditioner. Additionally, an accommodation space of the electric parts box 15 disposed in the compressor chamber 14 of the outdoor unit 12 of the air conditioner can be flattened and made compact, so that flexibility for another part space is increased to enable assembling work to be done easily.

What is claimed is:

1. A four-way lead flat package IC-mount printed circuit board comprising a printed circuit board on which a four-way lead flat package IC is to be mounted and which has front soldering land groups and rear soldering land groups for soldering the four-way lead flat package IC, the printed circuit board including solder drawing lands formed in a neighboring area between the front soldering land groups and the rear soldering land groups adjacent to the front soldering land groups, and/or a trailing area of the rear soldering land groups, wherein each of the solder drawing lands has a slit formed substantially parallel to lines of adjacent soldering lands of the front soldering land groups or the rear soldering land groups located in front of the solder drawing land, a forward portion and a backward portion respectively formed on the forward side and the backward side of the slit and joint portions formed on both sides of the slit for connecting the forward portion and the backward portion.

2. The four-way lead flat package IC-mount printed circuit board according to claim 1, wherein the front soldering land groups consist of front trailing soldering lands located in the leading area of the groups and front trailing soldering lands located in the trailing area of the groups, the rear soldering land groups consist of rear soldering lands located in the leading areas of the groups and rear trailing soldering lands located in the trailing areas of the groups, and each of the trailing soldering lands of the front soldering land groups or the rear soldering land groups is formed to be longer than the soldering lands located in front of the trailing land.

3. The four-way lead flat package IC-mount printed circuit board according to claim 1, wherein the backward portion is made larger in surface area than the forward portion.

4. The four-way lead flat package IC-mount printed circuit board according to claim 3, wherein the solder drawing lands joint portions are formed of copper foil.

5. The four-way lead flat package IC-mount printed circuit board according to claim 1, wherein the four-way lead flat package IC is placed obliquely during soldering with respect to a solder flow traveling direction over a jet-flow soldering bath.

6. The four-way lead flat package IC-mount printed circuit board according to claim 1, wherein the four-way lead flat package IC is soldered using lead-free solder.

7. An air conditioner having an electrical parts box, accommodating the four-way lead flat package IC-mount printed circuit defined in claim 1, which is located in an area above a compressor in a compressor chamber.

8. A method of soldering a four-way lead flat package IC on a printed circuit board on which the four-way lead flat package IC is to be mounted and which has front soldering land groups and rear soldering land groups for soldering the four-way lead flat package IC, the method comprising:

a step of mounting the four-way lead flat package IC on the printed circuit board prepared with solder drawing lands formed in a neighboring area, between the front soldering land groups and the rear soldering land groups adjacent to the front soldering land groups, and/or a trailing area of the rear soldering land groups, each of the solder drawing lands having a slit formed substantially parallel to lines of adjacent soldering lands of the front soldering land groups or the rear soldering land groups located in front of the solder drawing land;

a step of applying flux active agent on the printed circuit board on which the four-way lead flat package IC is mounted;

a step of preheating the flux active agent to active temperatures;

a step of first solder jet-flowing for soldering lead portions of the four-way lead flat package IC mounted on the printed circuit board, using a jet-flow type soldering bath; and a step of second solder jet-flowing for removing solder bridges formed between the lead portions of the four-way lead flat package IC during the first solder jet-flowing step, by the solder drawing lands having the slits.

9. The method of soldering the four-way lead flat package IC on the printed circuit board according to claim 8, wherein the four-way lead flat package IC is transferred during soldering in a solder flow traveling direction over a jet-flow soldering bath and the front soldering land groups and the rear soldering land groups are inclined with respect to the solder flow traveling direction.

\* \* \* \* \*